United States Patent
Amano et al.

(10) Patent No.: US 8,882,910 B2
(45) Date of Patent: Nov. 11, 2014

(54) ALGAN SUBSTRATE AND PRODUCTION METHOD THEREOF

(75) Inventors: Hiroshi Amano, Nagoya (JP); Akira Bando, Ichihara (JP)

(73) Assignee: Toyoda Gosei Co., Ltd., Aichi (JP)

(*) Notice: Subject to any disclaimer, the term of this patent is extended or adjusted under 35 U.S.C. 154(b) by 868 days.

(21) Appl. No.: 12/434,916

(22) Filed: May 4, 2009

(65) Prior Publication Data

US 2009/0239357 A1   Sep. 24, 2009

Related U.S. Application Data

(62) Division of application No. 11/390,316, filed on Mar. 28, 2006, now abandoned.

(30) Foreign Application Priority Data

Mar. 28, 2005  (JP) .................................. 2005-92079

(51) Int. Cl.
| | |
|---|---|
| C30B 25/14 | (2006.01) |
| C03B 25/02 | (2006.01) |
| C30B 29/40 | (2006.01) |
| H01L 21/02 | (2006.01) |
| H01L 33/00 | (2010.01) |

(52) U.S. Cl.
CPC .............. C03B 25/02 (2013.01); C30B 29/403 (2013.01); H01L 21/0237 (2013.01); H01L 21/0242 (2013.01); H01L 21/0254 (2013.01); H01L 21/0262 (2013.01); H01L 33/0075 (2013.01); Y10S 117/915 (2013.01)
USPC .................. 117/104; 117/84; 117/88; 117/97; 117/915; 117/952

(58) Field of Classification Search
USPC ............ 117/84, 88, 97, 104, 915, 952; 16/84, 16/88, 97, 104, 915, 952
See application file for complete search history.

(56) References Cited

U.S. PATENT DOCUMENTS

| | | | | |
|---|---|---|---|---|
| 5,650,198 A | * | 7/1997 | Denbaars et al. | 427/255.394 |
| 6,673,149 B1 | * | 1/2004 | Solomon et al. | 117/90 |

(Continued)

FOREIGN PATENT DOCUMENTS

| | | |
|---|---|---|
| EP | 1405936 A1 | 4/2004 |
| JP | 2001181097 | 7/2001 |

(Continued)

OTHER PUBLICATIONS

Shigeru Inoue, et al.; Sumitomo Metal Industries Ltd. Corporate R&D Lab.; "Solution Growth of AlN Single Crystals on SiC Substrate Under Atmospheric Pressure and Temperature Gradient"; Extended Abstracts 1a-W-4 (The 65th Autumn Meeting, 2004); The Japan Society of Applied Physics; JSAP Catalog No. AP 041136-01; No. 1; 65th Scientific Meeting of Japan Society of Applied Physics, Resume of Oral Communication (held at Tohoku Gakuin University); Sep. 2004.

*Primary Examiner* — Matthew Song
(74) *Attorney, Agent, or Firm* — Sughrue Mion, PLLC

(57) ABSTRACT

A substrate is formed of $Al_xGa_{1-x}N$, wherein $0<x\leq1$. The substrate is a single crystal and is used producing a Group III nitride semiconductor device. A method for producing a substrate of $Al_xGa_{1-x}N$, wherein $0<x\leq1$, includes the steps of forming a layer of $Al_xGa_{1-x}N$, wherein $0<x\leq1$, on a base material and removing the base material. The method adopts the MOCVD method using a raw material molar ratio of a Group V element to Group III element that is 1000 or less, a temperature of 1200° C. or more for forming the layer of $Al_xGa_{1-x}N$, wherein $0<x\leq1$. The base material is formed of one member selected from the group consisting of sapphire, SiC, Si, ZnO and $Ga_2O_3$. The substrate is used for fabricating a Group III nitride semiconductor device.

2 Claims, 2 Drawing Sheets

(56) References Cited

U.S. PATENT DOCUMENTS

| | | |
|---|---|---|
| 2001/0038656 A1 | 11/2001 | Takeuchi et al. |
| 2003/0183158 A1 | 10/2003 | Maruska et al. |
| 2003/0205193 A1 | 11/2003 | Melnik et al. |
| 2003/0205195 A1 | 11/2003 | Chiyo et al. |
| 2003/0213964 A1* | 11/2003 | Flynn et al. ............. 257/85 |
| 2004/0119063 A1* | 6/2004 | Guo et al. ............... 257/13 |
| 2004/0189184 A1* | 9/2004 | Yasuda .................. 313/498 |
| 2005/0029507 A1 | 2/2005 | Usui et al. |
| 2005/0104162 A1* | 5/2005 | Xu et al. ................ 257/627 |
| 2005/0227453 A1* | 10/2005 | Miki et al. .............. 438/438 |

FOREIGN PATENT DOCUMENTS

| | | | |
|---|---|---|---|
| JP | 2002274996 | 9/2002 | |
| JP | 20042152 | 1/2004 | |
| JP | 2004231467 | 8/2004 | |
| JP | 2004284870 | 10/2004 | |
| WO | WO 03068699 A1 * | 8/2003 | ......... C30B 29/38 |
| WO | 2004053210 A1 | 6/2004 | |

\* cited by examiner

ALGAN SUBSTRATE AND PRODUCTION METHOD THEREOF

CROSS REFERENCE TO RELATED APPLICATION

This application is a Divisional of U.S. patent application Ser. No. 11/390,316 filed Mar. 28, 2006, now abandoned, which claims benefit of Japanese Patent Application No. 2005-092079 filed Mar. 28, 2005. The above noted applications are incorporated herein by reference in their entirety.

BACKGROUND OF THE INVENTION

1. Field of the Invention

The present invention relates to an AlGaN substrate and a production method thereof.

2. Description of the Prior Art

A Group III nitride semiconductor has heretofore been utilized as a functional material for configuring Group III nitride semiconductor light-emitting devices of p-n junction structure, such as Light-Emitting Diodes (LEDs), Laser Diodes (LDs), etc., emitting visible light of short wavelength. In this case, in configuring an LED having a light-emitting layer of gallium indium nitride (GaInN), for example, to enhance the quality of the light-emitting layer and emitting light of blue or green band, a layer of gallium nitride (GaN) has been formed on a substrate in a thickness of several μm (hereinafter called an "under layer") to improve the crystallinity thereof and make it easy to extract light. When fabricating a device necessitating crystallinity of higher quality, such as an LD, a crystal has been deposited on a processed substrate or a processed under layer in order to enhance the crystallinity of the under layer, thereby reducing the dislocation and, in order to further reducing the dislocation density, a self-independent GaN substrate has been used. Use of a GaN substrate is advantageous in that a resonator end face in an LD can be formed into a cleaved surface and is very effective.

On the other hand, in a light-emitting device emitting light in the ultraviolet or deep-ultraviolet region and having a light-emitting layer of gallium nitride or aluminum gallium nitride ($Al_xGa_{1-x}N$ ($0<x\leq1$)), since the GaN absorbs light having a wavelength of 360 nm or less, the light emitted from the light-emitting layer is absorbed to lower the luminous efficiency. In the structure of a layer of $Al_xGa_{1-x}N$ ($0<x\leq1$) on GaN, cracks are easy to form due to the differences in lattice constant and in thermal expansion coefficient to hinder the fabrication of a device. The formation of cracks becomes conspicuous with an increase of an Al composition, and the larger the Al composition, the larger the affection thereof on devices of a short wavelength.

As a method to solve the problem, attempts have been made to form, in a region having a relatively small Al composition of 50% or less, an under layer of aluminum gallium nitride ($Al_xGa_{1-x}N$ ($0<x\leq1$)) via a GaN or AlN buffer layer on an under layer. In this method, however, it is difficult to suppress crack formation in a region having a large Al composition and, even when the crack formation can be suppressed, the dislocation density is large. Thus, such a substrate cannot be used as the substrate for a light-emitting device.

As a substrate having a large Al composition, a lettering guide substrate having AlN stacked on a base material of sapphire has been developed (see, for example, JP-A 2002-274996). In the case of the lettering guide substrate, the sapphire base material is deteriorated at a high temperature of 1500° C. or more and, at a higher temperature, it is impossible to stack aluminum gallium nitride ($Al_xGa_{1-x}N$ ($0<x\leq1$)). In view of the above and in the same manner as in the fact that a self-independent GaN substrate is effective for a blue LED with respect to an aluminum gallium nitride ($Al_xGa_{1-x}N$ ($0<x\leq1$)) Group III nitride semiconductor of ultraviolet or deep-ultraviolet region having a large Al composition, it is required that a self-independent substrate of AlN or $Al_xGa_{1-x}N$ ($0<x\leq1$) is used for the purpose of enhancing the crystal quality resulting from reduction in light absorption and dislocation density and also enhancing the cleaved surface property for the formation of an LD end face.

As regards the fabrication of an aluminum nitride substrate, while applying the GaN substrate fabrication technique, the sublimation method (see, for example, JP-A 2004-284870), the flux method (see, for example, JP-A 2004-231467), the HVPE method (see, for example, JP-A 2001-181097), the amonothermal process (see, for example, JP-A 2004-002152 and the solution technique (see, for example, App. Phys. Soc. Autumn General Meeting, 2004, papers, 1a-W-4) are attempted.

For the fabrication of a substrate of $Al_xGa_{1-x}N$ ($0<x\leq1$) that is a mixed crystal of AlN and GaN, a vapor phase growth method is dominant. The HVPE method is a vapor phase growth method and enables the compositions of AlN and GaN to be controlled and, therefore, has a high probability.

On the other hand, the MOCVD method that is a vapor phase growth method similar to the HVPE method has a feature capable of controlling the composition of a mixed crystal of AlN and GaN with higher precision than the HVPE method and is optimum as a method for depositing a layer of $Al_xGa_{1-x}N$ ($0<x\leq1$). The MOCVD method makes it possible to enlarge a device and is excellent in productivity. Almost all the LEDs, LDs and electronic devices using Group III nitride semiconductors, available on the market at present utilize the MOCVD method to grow crystals, from which it is found that the MOCVD method is an effective method. However, since the growth speed in the MOCVD method is generally several μm/hr that is lower than that of the HVPE method that is several tens of μm/hr, the MOCVD method is disadvantage for depositing a crystal in a large thickness. Therefore, it is still difficult to deposit a layer of $Al_xGa_{1-x}N$ ($0<x\leq1$) in a thickness of several tens to several hundreds of μm required as the thickness of a substrate.

If it is possible to deposit the crystal in a large thickness, with the growth speed increased in the MOCVD method, however, a substrate of $Al_xGa_{1-x}N$ ($0<x\leq1$) can be fabricated, with the composition of the $Al_xGa_{1-x}N$ ($0<x\leq1$) controlled with high precision.

An object of the present invention is to obtain a self-independent substrate of $Al_xGa_{1-x}N$ ($0<x\leq1$) through a method comprising using the MOCVD method to deposit a layer of $Al_xGa_{1-x}N$ ($0<x\leq1$) in a thickness of several tens to several hundreds of μm at high growth speed on a base material and then removing the base material, thereby materializing a Group III nitride semiconductor excellent in luminous efficiency in the ultraviolet and deep-ultraviolet regions. By using the substrate, it is made possible to provide a Group III nitride semiconductor light-emitting device excellent in luminous efficiency in the ultraviolet and deep-ultraviolet regions.

SUMMARY OF THE INVENTION

The present invention provides a substrate comprising $Al_xGa_{1-x}N$, wherein $0<x\leq1$.

The substrate is formed of a single crystal.

The substrate is for use in producing a Group III nitride semiconductor device.

The present invention also provides a method for producing a substrate of $Al_xGa_{1-x}N$, wherein $0<x\leq 1$, comprising the steps of forming a layer of $Al_xGa_{1-x}N$, wherein $0<x\leq 1$, on a base material and removing the base material.

In the method, the step of forming a layer of $Al_xGa_{1-x}N$, wherein $0<x\leq 1$, is performed by the MOCVD method.

The MOCVD method adopts a speed of growth of 5 μm/hour for forming the layer of $Al_xGa_{1-x}N$, wherein $0<x\leq 1$.

The MOCVD method adopts a raw material molar ratio of a Group V element to Group III element that is 1000 or less for forming the layer of $Al_xGa_{1-x}N$, wherein $0<x\leq 1$.

The MOCVD method adopts a temperature of 1200° C. or more for forming the layer of $Al_xGa_{1-x}N$, wherein $0<x\leq 1$.

The base material is formed of one member selected from the group consisting of sapphire, SiC, Si, ZnO and $Ga_2O_3$.

The present invention further provides a Group III nitride semiconductor device using the substrate set forth in any one of the above.

The substrate of $Al_xGa_{1-x}N$, wherein $0<x\leq 1$, according to the present invention is effective for fabricating a Group III nitride semiconductor device, particularly, light-emitting devices capable of emitting light in the ultraviolet or deep-ultraviolet region having a wavelength of 360 nm or less, the application of which has been expected in the fields of medicine and high-precision processing. In the case of using a conventional template substrate using a GaN layer as an under layer or a conventional self-independent GaN substrate, the light emitted from the light emitting layer has been absorbed in the GaN layer or substrate. Also in the case of depositing an AlGaN layer having a high Al composition on a GaN layer, due to the difference in lattice constant and thermal expansion coefficient therebetween, the characteristic inferiority, such as formation of cracks, adversely affecting the device characteristics has arisen.

On the other hand, in the case of using AlGaN substrate having a composition permitting transmission of an emission wavelength, no light is absorbed in the substrate to heighten the luminous efficiency. In addition, since the difference in lattice constant and thermal expansion coefficient from the light-emitting layer becomes small, cracks are difficult to produce and the crystallinity is enhanced. When using the MOCVD method, it is possible to produce an AlGaN substrate excellent in composition controllability and high in productivity.

When the substrate is utilized for LEDs or LDs emitting light in the ultraviolet or deep-ultraviolet regions having a wavelength of around 360 nm to 200 nm to enable high-output devices enhanced in luminous efficiency as compared with the conventional ones to be fabricated. Furthermore, since significant enhancement of the crystallinity can be expected, light-emitting devices capable of emitting light in short-frequency regions can be materialized.

The present invention lies in a self-independent substrate of $Al_xGa_{1-x}N$, wherein $0<x\leq 1$, obtained through deposition of a layer of $Al_xGa_{1-x}N$, wherein $0<x\leq 1$, on a base material and subsequent removal of the base material. However, a template substrate of $Al_xGa_{1-x}N$, wherein $0<x\leq 1$, can be adopted insofar as the layer of $Al_xGa_{1-x}N$, wherein $0<x\leq 1$, has a good quality even deposited in a small thickness on a base material and cannot be self-independent when having removed the base material. Since the template substrate can be utilized in a state having not removed the base material, it can secure the mechanical strength and be applied to various processes. When utilizing the template substrate for a device, however, since the optical and electrical characteristics of the base material affect the device, it is necessary take the extraction of light and structure of electrodes into consideration.

The above and other objects, characteristics and advantages of the present invention will become apparent to those skilled in the art from the description to be given herein below with reference to the accompanying drawings.

DETAILED DESCRIPTION OF THE PREFERRED EMBODIMENTS

Figure 1:
FIG. 1 is a cross section showing the structure having an AlN layer deposited on a sapphire substrate, which is produced in Example 1.

As a base material used for producing a substrate of $Al_xGa_{1-x}N$ ($0<x\leq 1$) according to the present invention, sapphire ($\alpha$-$Al_2O_3$) that is relatively high in melting point and heat-resistant, single crystal oxide material including zinc oxide (ZnO) and gallium oxide ($Ga_2O_3$), silicon single crystal (silicon) and IV Group semiconductor single crystal including cubic or hexagonal silicon carbide (SiC) can be cited.

The substrate of $Al_xGa_{1-x}N$, wherein $0<x\leq 1$, according to the present invention can be formed by vapor phase growth methods including the MetalOrganic Chemical Vapor Deposition (MOCVD), MetalOrganic Vapor Phase Epitaxy (MOVPE), OrganoMetal Vapor Phase Epitaxy (OMVPE), Molecular Beam Epitaxy (MBE) and Hydride Vapor Phase Epitaxy (HVPE). When the crystal is limited to AlN crystal, the sublimation method and liquid phase growth method can also be adopted. Of these methods, the MOCVD method is preferable.

The vapor phase growth method can fabricate an AlGaN mixed crystal more easily than the liquid phase method. In addition, the MOCVD method can control a composition more easily than the HVPE method and can adopt a higher growth speed than the MBE method.

In the MOCVD method, hydrogen ($H_2$) or nitrogen ($N_2$) is used as a carrier gas, TriMethyl Gallium (TMG) or Triethyl Gallium (TEG) is used as a source of Ga that is a Group III metal, TriMethyl Aluminum (TMA) or TriEthyl Aluminum (TEA) is used as an Al source, TriMethyl Indium (TMI) or TriEthyl Indium (TEI) is used as an In source, and ammonium ($NH_3$) or hydrazine ($N_2H_4$) is used as a nitrogen source.

In the MOCVD method, preferably, the raw materials mentioned above are used to grow on a base material a substrate of $Al_xGa_{1-x}N$ ($0<x\leq 1$) at a temperature of 1200° C. or more in accordance with an intended object. When the temperature is less than 1200° C., in a substrate of $Al_xGa_{1-x}N$ ($0<x\leq 1$) having a high Al composition, the crystal quality will be deteriorated. A V/III ratio of 1 or more and 1000 or less is suitable. It is preferably 1 or more and 200 or less and more preferably 1 or more and 100 or less.

At the V/III ratio of more than 1000 that has heretofore been generally adopted, a good-quality AlGaN crystal cannot be obtained. By using a high temperature and lowering the V/III ratio, the motion of Al on a crystal growth surface is made active, thereby enabling a flat good-quality crystal to be obtained.

Growth at a growth speed of 5 μm/hr or more is suitable. The growth speed is preferably 10 μm/hr or more and more preferably 20 μm/hr or more.

Since a substrate is required to have a thickness of several tens to several hundreds of μm, in view of the productivity, the growth speed is required to be high. By the growth at high temperature and low III/V ratio in the present invention, a large growth speed can be obtained.

It is desirable to start growth of $Al_xGa_{1-x}N$ (0<x≤1) from an Al molecular layer. For this, when the MOCVD method is used to grow $Al_xGa_{1-x}N$ (0<x≤1), a method comprising a first step of introducing an Al raw material alone and a subsequent step of adding a nitrogen raw material is appropriate. When adopting a small V/III ratio of 1 to 100 in place of the first step mentioned above, aluminum (Al) raw material and nitrogen (N) raw material may be supplied at the same time.

As a method for causing the layer of $Al_xGa_{1-x}N$ (0<x≤1) to exfoliate from the base material, polishing of the base material, etching with an acid, irradiation of the back surface with a laser to melt the interface between the base material and the layer of $Al_xGa_{1-x}N$ (0<x≤1) can be cited. Otherwise, by subliming or melting the base material alone in a high-temperature furnace, the layer of $Al_xGa_{1-x}N$ (0<x≤1) can be taken out.

The present invention will be described in more detail with reference to examples. However, the present invention is not limited to these examples.

Example 1

Figure 2:
FIG. 2 is a cross section showing the state in which the sapphire substrate has been removed from the structure shown in FIG. 1.

FIG. 1 is a cross section typically showing a structure having an layer of AlN deposited on a sapphire substrate, and FIG. 2 is a cross section showing the AlN layer having exfoliated from the sapphire substrate.

A structure having an AlN layer deposited on a sapphire substrate was produced in accordance with the following procedure using the ordinary pressure-reduced MOCVD means. First, a (0001-sapphire substrate 1 was placed on a susceptor having highly pure graphite (for a semiconductor) coated with tantalum carbide (TaC). The resultant susceptor was set in position within a vapor phase growth reaction furnace formed of stainless steel and highly pure graphite (for a semiconductor) coated with thermally decomposed carbon (PYROCARB), and nitrogen gas was circulated within the reaction furnace to purge the inside of the reaction furnace.

Once the inside of the vapor phase growth reaction furnace was evacuated, hydrogen and nitrogen were circulated within the reaction furnace and the inside of the reaction furnace was maintained under 100 torr (13.3 kPa). A resistance heater was then operated to elevate the room temperature to 1500° C. for 10 minutes. With the temperature of the substrate 1 maintained at 1500° C., hydrogen gas and nitrogen gas were continuously circulated within the reaction furnace for five minutes, thereby subjecting the surface of the substrate 1 to thermal cleaning.

Subsequently, the temperature of the substrate 1 was lowered to 1400° C. After confirming that the temperature of 1400° C. was stabilized, hydrogen gas accompanied by TMA vapor was supplied into the vapor phase growth reaction furnace for 10 minutes. By so doing, the sapphire substrate was covered with aluminum atoms or the aluminum atoms are allowed to react with nitrogen atoms resulting from decomposition of the nitrogen-containing deposit having previously adhered to the inner wall of the vapor phase growth reaction furnace to partially form AlN. At any rate, an Al-rich layer was formed on the sapphire substrate 1.

Then, ammonium ($NH_3$) gas was supplied into the vapor phase growth reaction furnace so that a V/III ratio might be 100 to grow the AlN film for four hours.

Subsequently, the supply of TMA was stopped and the temperature was lowered to 300° C., then the supply of ammonium was stopped and the temperature was lowered to room temperature. The inside of the vapor phase growth reaction furnace was evacuated, then nitrogen was substituted and the pressure was brought to an atmospheric pressure. Thereafter, the wafer placed on the susceptor was taken out.

The wafer taken out was partially divided to enable the divided cross section to be observed. The cross section was observed with a Scanning Electron Microscope (SEM) to find that an AlN film of about 100 μm was deposited. An X-ray diffraction was used to find that the half-value widths of the diffraction peaks at the (0002) and (10-10) planes were 500 seconds and 1000 seconds, respectively, and confirm that the AlN film was a single crystal.

The sapphire base material was removed by polishing to obtain an AlN substrate having a thickness of 100 μm.

Example 2

Figure 3:
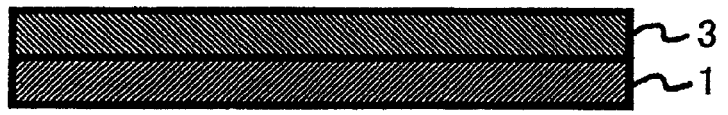
FIG. 3 is a cross section showing the structure having a layer of $Al_{0.9}Ga_{0.1}N$ deposited on a sapphire substrate, which is produced in Example 2.
Figure 4:
FIG. 4 is a cross section showing the state in which the sapphire substrate has been removed from the structure shown in FIG. 3.
Figure 5:
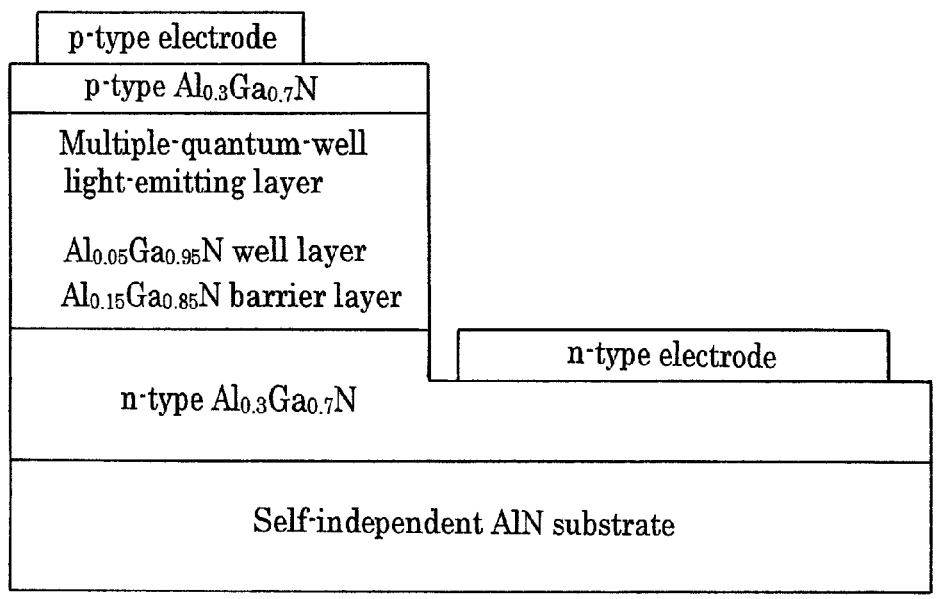
FIG. 5 is a cross section showing the structure of an Led fabricated in Example 6.
Figure 6:
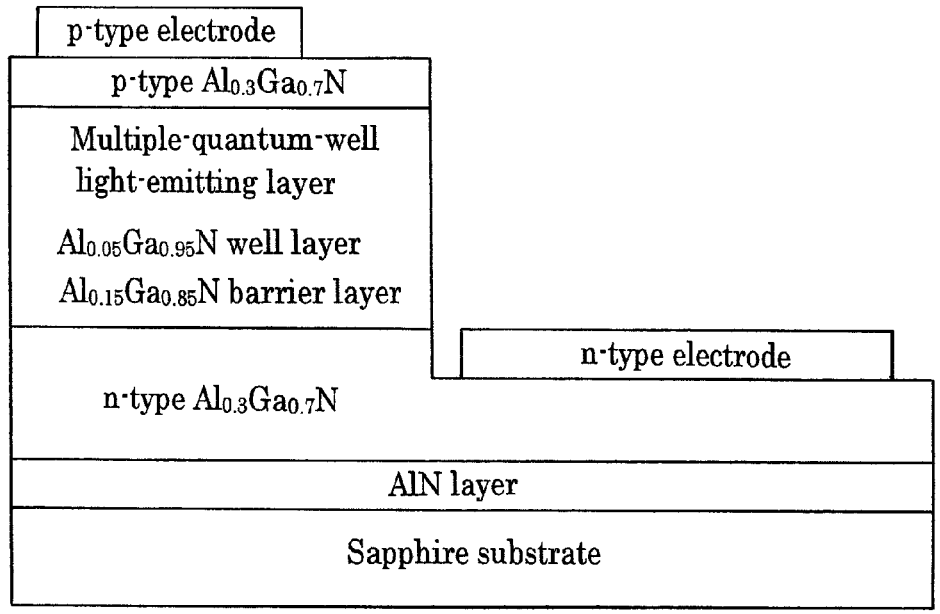
FIG. 6 is a cross section showing the structure of an LED fabricated in Example 7.

In place of the AlN film of the stacked structure fabricated in Example 1, an $Al_xGa_{1-x}N$ (0<x≤1) film was stacked on the sapphire substrate. FIG. 3 schematically shows the cross section of the structure having the $Al_xGa_{1-x}N$ (0<x≤1) film on the sapphire substrate. FIG. 4 shows the structure of $Al_xGa_{1-x}N$ (0<x≤1) film having exfoliated from the sapphire substrate.

The fabrication method was the same as that in Example 1 while TMA and TMG were supplied as the raw materials for four hours to fabricate an $Al_xGa_{1-x}N$ (0<x≤1) film in place of the four-hour growth of the AlN layer in Example 1.

The $Al_xGa_{1-x}N$ (0<x≤1) film formation condition was that ammonium ($NH_3$) gas was supplied into the vapor growth reaction furnace so that a V/III ratio might be 100.

The wafer taken out was partially divided to enable the divided cross section to be observed. The cross section was observed with an SEM to find that an AlN film of about 80 μm was deposited. An X-ray diffraction was used to find that the half-value widths of the diffraction peaks at the (0002) and (10-10) planes were 500 seconds and 1000 seconds, respectively, and confirm that the AlN film was a single crystal. In addition, it was confirmed from the diffraction angle that the composition was $Al_{0.9}Ga_{0.1}N$.

The sapphire base material was then removed by polishing to obtain a substrate of $Al_{0.9}Ga_{0.1}N$.

Example 3

An AlN substrate was fabricated by following the procedure in Example 1 while the growth temperature in the AlN stacked structure fabricated in Example 1 was set to be 1150° C.

As a result, the half-value width of the diffraction peak at the (0002) plane by the X-ray diffraction was 2000 seconds or more. Thus, the AlN substrate was lower in crystallinity than that in Example 1.

Example 4

An AlN substrate was fabricated by following the same growth conditions as in Example 1 while the V/III ratio in the AlN stacked structure fabricated in Example 1 was set to 2000.

As a result, the half-value width of the diffraction peak at the (0002) plane by the X-ray diffraction was 500 seconds that was equal to that in Example 1. However, the AlN deposited layer has a small thickness of 10 μm. When the sapphire base material was removed by polishing, the AlN substrate was low in strength as a self-independent substrate.

Example 5

An AlN substrate was fabricated by following the same growth conditions as in Example 1 while the growth speed in the AlN stacked structure fabricated in Example 1 was changed to 1 μm/hr and to 5 μm/hr. The results were compared with that in Example 1 and are shown in Table 1 below.

TABLE 1

| AlN growth speed (μm/hr) | Half-value width at (0002) plane by XRD (arcsec) |
|---|---|
| 1 | 1000 |
| 5 | 600 |
| 25 | 500 |

As shown in Table 1 above, the half-value width at the (0002) plane by the X-ray diffraction at the growth speed of 5 μm/hr or 25 μm/hr was better than that at the growth speed of 1 μm/hr. In the case of the low growth speed of 1 μm/hr, it took 100 hours to grow the AlN layer to have a thickness of 100 μm. Since the deposit on the inner wall of the reactor is deposited on the epitaxial growth surface to coarsen the growth surface during the growth time, the growth in a flat surface state cannot continue and, midway the growth, extraordinary growth arises. On the other hand, a higher growth speed can shorten the growth time and cause the deposit to be less liable to adversely affect the growth surface, resulting in retention of the flat surface.

Example 6

An LED was fabricated using the self-independent AlN substrate fabricated in Example 1 and utilizing the ordinary pressure-reduced MOCVD means in accordance with the following procedure. The fundamental epitaxial growth conditions were the same as those in Example 1. First, the self-independent AlN 2 was placed on a susceptor having highly pure graphite (or a semiconductor) coated with tantalum carbide (TaC). The resultant susceptor was set in position within a vapor phase growth reaction furnace formed of stainless steel and highly pure graphite (for a semiconductor) coated with thermally decomposed carbon (PYROCARB), and nitrogen gas was circulated within the reaction furnace to purge the inside of the reaction furnace.

Once the inside of the vapor phase growth reaction furnace was evacuated, hydrogen, nitrogen and ammonium were circulated within the reaction furnace and the inside of the reaction furnace was maintained under 100 torr (13.3 kPa). A resistance heater was then operated to elevate the temperature of the substrate 2 from the room temperature to 1500° C. for 10 minutes. With the temperature of the substrate 2 maintained at 1500° C., hydrogen, nitrogen and ammonium were continuously circulated within the reaction furnace for five minutes, thereby subjecting the surface of the substrate 2 to thermal cleaning.

Subsequently, the temperature of the substrate 2 was lowered to 1150° C. After confirming that the temperature of 1150° C. was stabilized, hydrogen gas accompanied by TMA vapor, TMG vapor and TetraMethyl Silane (TMSi) vapor was supplied into the vapor phase growth reaction furnace for one hour to form an n-type $Al_{0.3}Ga_{0.7}N$ layer. Next, a light-emitting layer of a quantum well structure comprising a barrier layer of $Al_{0.15}Ga_{0.85}N$ and a well layer of $Al_{0.05}Ga_{0.95}N$ was formed. Furthermore, TMA and TMG were added with ethylcyclopentadienyl magnesium (EtCp$_2$Mg) to form a p-type $Al_{0.3}Ga_{0.7}N$ layer. Finally, the growth temperature was lowered to 1050° C. to form a p-type GaN layer. The compositions of the AlGaN layers were controlled with the ratios of TMA and TMG supplied.

Subsequently, the supply of the organometal raw materials was stopped and the temperature was lowered to 300° C., then the supply of ammonium was stopped and the temperature was lowered to room temperature. The inside of the vapor phase growth reaction furnace was evacuated, then nitrogen was substituted and the pressure was brought to an atmospheric pressure. Thereafter, the wafer placed on the susceptor was taken out.

An LED device was fabricated using the wafer taken out. As a result, the emission wavelength thereof was 320 nm, the voltage through flow of a current of 20 mA was 5 V and the output was 1 mW.

Example 7

An LED was fabricated by following the procedure in Example 6 while a template having an AlN layer of 1 μm stacked on a sapphire base material was used in place of the self-independent AlN substrate in the LED fabricated in Example 6.

As a result, the emission wavelength thereof was 320 nm, the voltage through flow of a current of 20 mA was 5 V and the output was 0.1 mW One tenth output could only be obtained as compared with the output when using the self-independent AlN substrate.

What is claimed is:

1. A method for producing a substrate of $Al_xGa_{1-x}N$, wherein $0<x\leq 1$, comprising the steps of:
   first, either introducing an Al raw material alone, or introducing Al raw material and nitrogen (N) raw material where a molar ratio V/III being adjusted to 1 to 100;
   next, adjusting a molar ratio of a Group V element to a Group III element that is 200 or less and forming a layer of $Al_xGa_{1-x}N$, wherein $0<x\leq 1$, on a base material at a temperature of 1400° C. or higher by a MOCVD method; and
   subsequently, removing the base material.

2. A method according to claim 1, wherein the base material is formed of one member selected from the group consisting of sapphire, SiC, Si, ZnO and $Ga_2O_3$.

* * * * *